United States Patent
Sung et al.

(10) Patent No.: US 9,508,604 B1
(45) Date of Patent: Nov. 29, 2016

(54) METHODS OF FORMING PUNCH THROUGH STOP REGIONS ON FINFET DEVICES ON CMOS-BASED IC PRODUCTS USING DOPED SPACERS

(71) Applicant: GLOBALFOUNDRIES Inc., Grand Cayman (KY)

(72) Inventors: Min Gyu Sung, Latham, NY (US); Chanro Park, Clifton Park, NY (US); Hoon Kim, Clifton Park, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/142,052

(22) Filed: Apr. 29, 2016

(51) Int. Cl.
*H01L 29/66* (2006.01)
*H01L 21/8238* (2006.01)
*H01L 21/311* (2006.01)
*H01L 21/3115* (2006.01)

(52) U.S. Cl.
CPC .. *H01L 21/823821* (2013.01); *H01L 21/31111* (2013.01); *H01L 21/31155* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 9,397,002 B1* | 7/2016 | Belyansky | H01L 21/823412 |
| 2009/0184369 A1* | 7/2009 | Zhu | B82Y 10/00 |
| | | | 257/347 |
| 2013/0078818 A1* | 3/2013 | Lin | H01L 29/66795 |
| | | | 438/761 |
| 2014/0048857 A1* | 2/2014 | Cheng | H01L 29/66477 |
| | | | 257/288 |
| 2015/0303284 A1* | 10/2015 | Basker | H01L 29/66803 |
| | | | 257/288 |
| 2016/0104776 A1* | 4/2016 | Ching | H01L 29/1083 |
| | | | 257/401 |
| 2016/0104801 A1* | 4/2016 | Zhu | H01L 29/66795 |
| | | | 365/185.25 |
| 2016/0155739 A1* | 6/2016 | Ting | H01L 27/0886 |
| | | | 257/401 |
| 2016/0181092 A1* | 6/2016 | Ganz | H01L 29/66795 |
| | | | 716/103 |
| 2016/0204039 A1* | 7/2016 | Togo | H01L 21/823814 |
| | | | 257/369 |
| 2016/0225677 A1* | 8/2016 | Jacob | H01L 21/845 |

* cited by examiner

*Primary Examiner* — Alexander Ghyka
(74) *Attorney, Agent, or Firm* — Amerson Law Firm, PLLC

(57) ABSTRACT

One illustrative method disclosed herein includes, among other things, forming a first plurality of fins for a type 1 device and a second plurality of fins for a type 2 device, forming a first counter-doped sidewall spacer structure adjacent the first fins, forming a second counter-doped sidewall spacer structure adjacent the second fins and a counter-doped material structure in a space between the first fins, forming a recessed layer of flowable oxide on the devices such that portions of the first and second counter-doped sidewall spacers are exposed above the flowable oxide layer, and performing a common etching process operation to remove at least a portion of the exposed portions of the first and second counter-doped sidewall spacer structures.

25 Claims, 15 Drawing Sheets

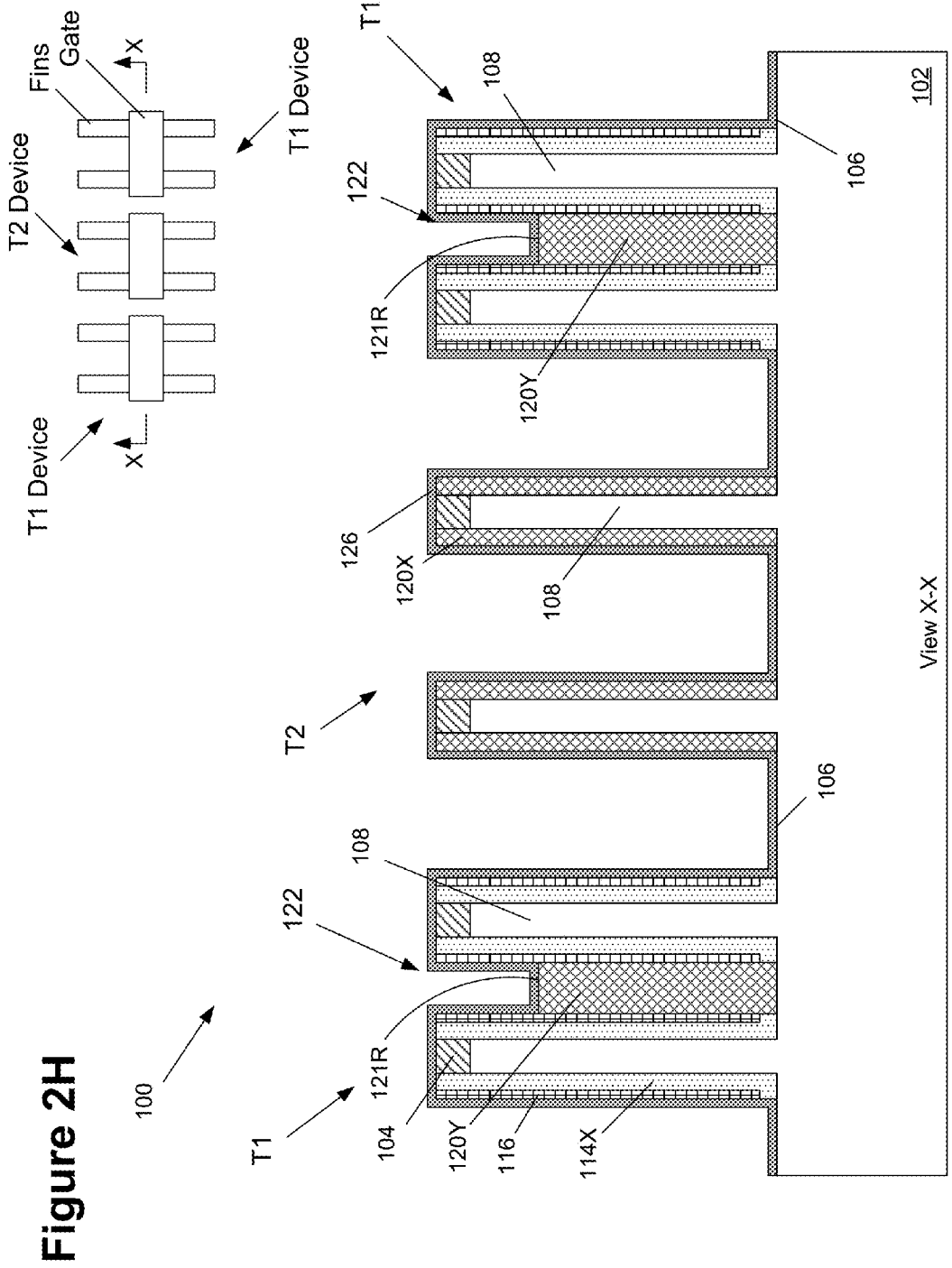

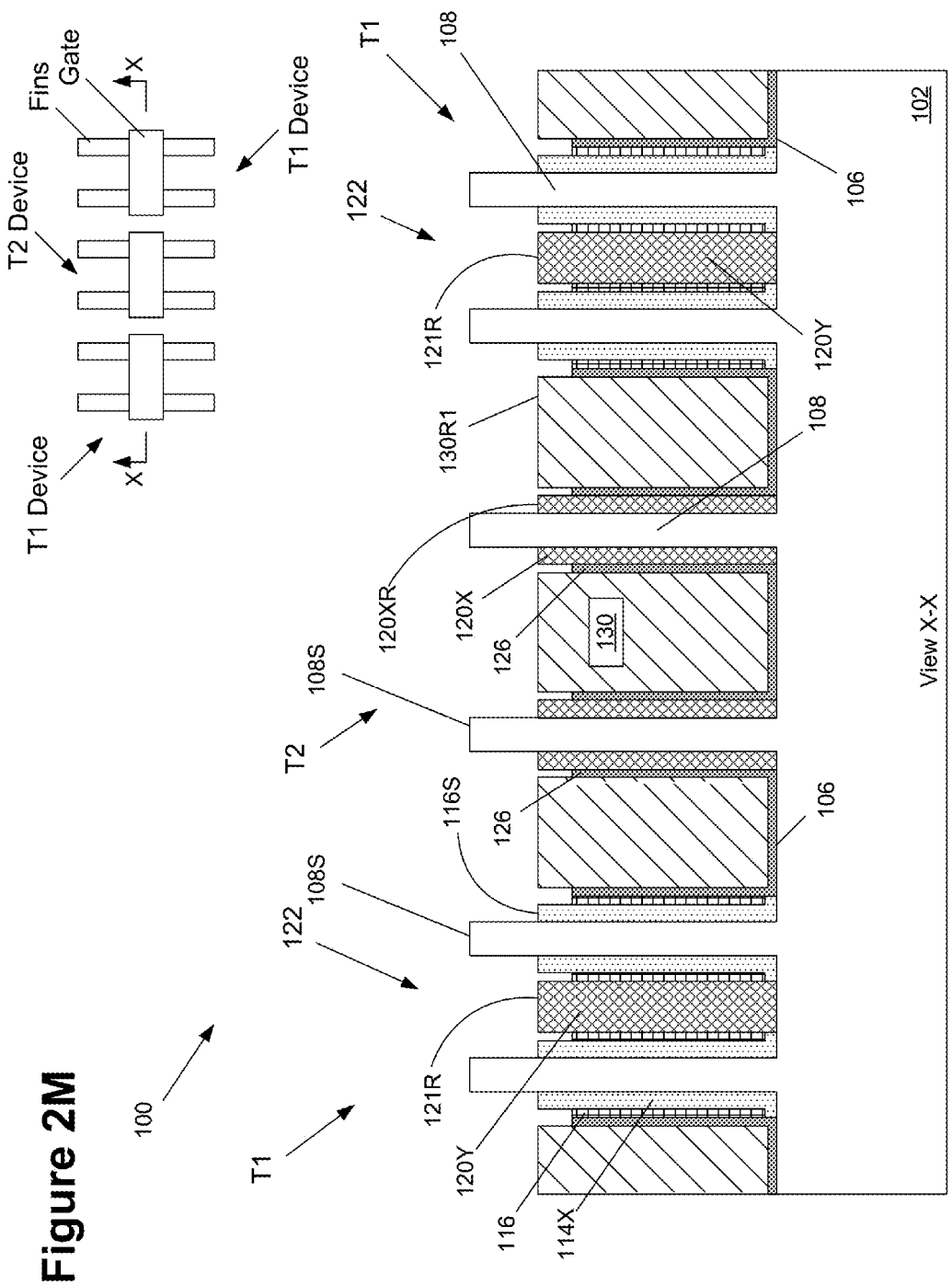

US 9,508,604 B1

METHODS OF FORMING PUNCH THROUGH STOP REGIONS ON FINFET DEVICES ON CMOS-BASED IC PRODUCTS USING DOPED SPACERS

BACKGROUND OF THE INVENTION

1. Field of the Invention

Generally, the present disclosure relates to the manufacture of semiconductor devices, and, more specifically, to various novel methods of forming punch through stop regions on FinFET devices on CMOS-based integrated circuit (IC) products using doped spacers.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices, i.e., an NMOS device and a PMOS device are opposite type devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art FinFET semiconductor device 10 that is formed above a semiconductor substrate 12 that will be referenced so as to explain, at a very high level, some basic features of a traditional FinFET device. In this example, the FinFET device 10 includes three illustrative fins 14, a gate structure 16, a sidewall spacer 18 and a gate cap 20. Trenches 13 are formed in the substrate 12 to define the fins 14. A recessed layer of insulating material 15 is positioned under the gate structure 16 and between the fins 14 in the areas outside of the gate structure, i.e., in the source/drain regions of the device 10. The gate structure 16 is typically comprised of a layer of insulating material (not separately shown), e.g., a layer of high-k insulating material or silicon dioxide, and one or more conductive material layers (e.g., metal and/or polysilicon) that serve as the gate electrode for the device 10. The fins 14 have a three-dimensional configuration: a height 14H, a width 14W and an axial length 14L. The axial length 14L corresponds to the direction of current travel, i.e., the gate length (GL) of the device 10 when it is operational. The gate width (GW) direction of the device 10 is also depicted in FIG. 1. As indicated, the gate width direction is transverse to the gate length direction. The portions of the fins 14 covered by the gate structure 16 is the channel region of the FinFET device 10. In a conventional process flow, the portions of the fins 14 that are positioned outside of the spacers 18, i.e., in the source/drain regions of the device 10, may be increased in size or even merged together (a situation not shown in FIG. 1A) by performing one or more epitaxial growth processes to grow additional semiconductor material on the fins in the source/drain regions of the device 10. The gate structures 16 for such FinFET devices may be manufactured using so-called "gate-first" or "replacement gate" (gate-last) manufacturing techniques.

One problem that is encountered in forming FinFET devices relates to preventing leakage currents underneath the fins 14, which are referred to as so-called "punch through" leakage currents. One prior art effort to eliminate or reduce such undesirable punch through leakage currents was performing an ion implantation process to form counter-doped punch through stop regions 22 that were positioned at approximately the intersection between the fin 14 and the remaining portion of the substrate 12. For an N-type device 10, the punch through stop regions 22 were created by implanting a P-type dopant, and for a P-type device 10 the punch through stop regions 22 were created by implanting an N-type dopant. The implant process that is performed to create the punch through stop regions 22 was typically performed shortly after formation of the fins 14 and prior to formation of the gate structure. However, obtaining an accurately doped punch through stop region 22 that is properly positioned underneath the active fin 14 is very difficult to accomplish, especially given that the additional thermal heating processes that are involved in subsequent process steps will further drive dopant diffusion and make it harder to control the location of the punch through stop regions 22. If the dopant from the counter-doped punch through stop regions 22 diffuses into the fins 14 during subsequent annealing processes, it would cause threshold voltage fluctuation because of the random amount of the counter-dopant diffused into fins 14 of different devices, which would severely compromise the circuit performance. Moreover, performing such ion implantation processes to form the punch through stop regions 22 can result in the formation of undesirable stacking faults in the upper portion of the fin 14, i.e., the region of the fin that will be surrounded by the gate structure 16 and serve as the channel region for the device 10. The presence of such stacking faults within the fin 14 may result in reduced device performance.

In some cases, efforts have been made to form such counter-doped regions 22 by depositing doped layers of silicon dioxide or forming doped spacers made of silicon dioxide adjacent the fins 14 and thereafter performing a heating process to cause the dopants in the layer of material or the spacer to migrate into the fins 14 at the desired location. One problem with this approach is that, in some cases, after formation of the layer of material or the spacers, the empty spaces between the fins 14 was typically filled with a flowable oxide material due to the better gap fill capabilities of the flowable oxide material as compared to deposited oxide materials, i.e., oxide material formed by, for example, plasma enhanced chemical vapor deposition (PECVD), chemical vapor deposition (CVD), atomic layer deposition (ALD), etc. Such flowable oxide material is typically formed by depositing a liquid-like state $SiO_x$ material and performing one or more heating processes to cure and densify the material to $SiO_2$. Unfortunately, the flowable oxide material tends to etch at a faster rate than does the deposited oxide materials that were used to form the doped layers of silicon dioxide or the doped silicon dioxide spacers. Using this prior art approach, when it came time to recess the various insulating materials so as to "reveal" the portion of the fin that will serve as the channel region for the device, it was difficult to accurately control the height of the revealed fin due to the difference in etch rate between the flowable oxide material and the deposited oxide materials. Such variations in fin height can lead to a reduction in device performance or inconsistency in the performance of integrated circuits incorporating such devices.

The present disclosure is directed to various novel methods of forming punch through stop regions on FinFET devices on CMOS-based IC products using doped spacers that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming punch through stop regions on FinFET devices on CMOS-based IC products using doped spacers. One illustrative method disclosed herein includes, among other things, forming a first plurality of fins for a type 1 device and a second plurality of fins for a type 2 device, wherein the type 1 and type 2 devices are opposite type devices, forming a first counter-doped sidewall spacer structure adjacent the first fins, forming a second counter-doped sidewall spacer structure adjacent the second fins and a counter-doped material structure in a space between the first fins. In this example the method also includes forming a recessed layer of flowable oxide on the type 1 and type 2 devices such that a portion of the first counter-doped sidewall spacer and a portion of the second counter-doped spacer is exposed above the flowable oxide layer, and performing a common etching process operation to remove at least a portion of the exposed portions of the first counter-doped sidewall spacer structure and the second counter-doped sidewall spacer structure so as to reveal at least a portion of the first and second plurality of fins, respectively.

BRIEF DESCRIPTION OF THE DRAWINGS

The disclosure may be understood by reference to the following description taken in conjunction with the accompanying drawings, in which like reference numerals identify like elements, and in which.

Figure 1:
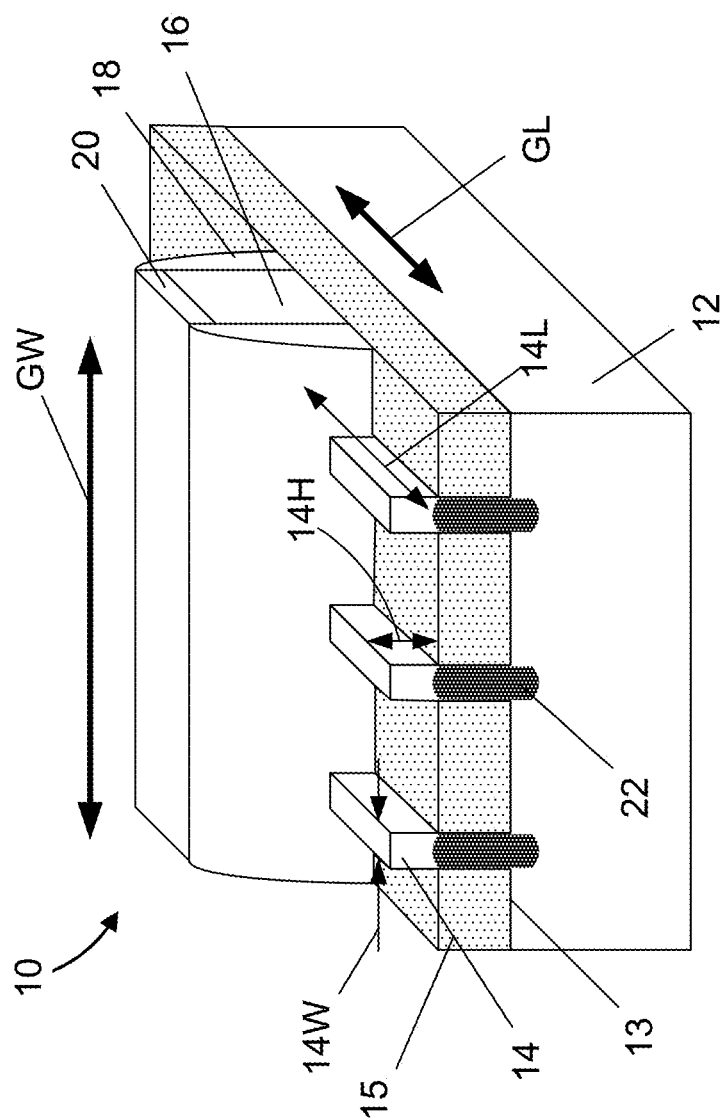
FIG. 1 depicts an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
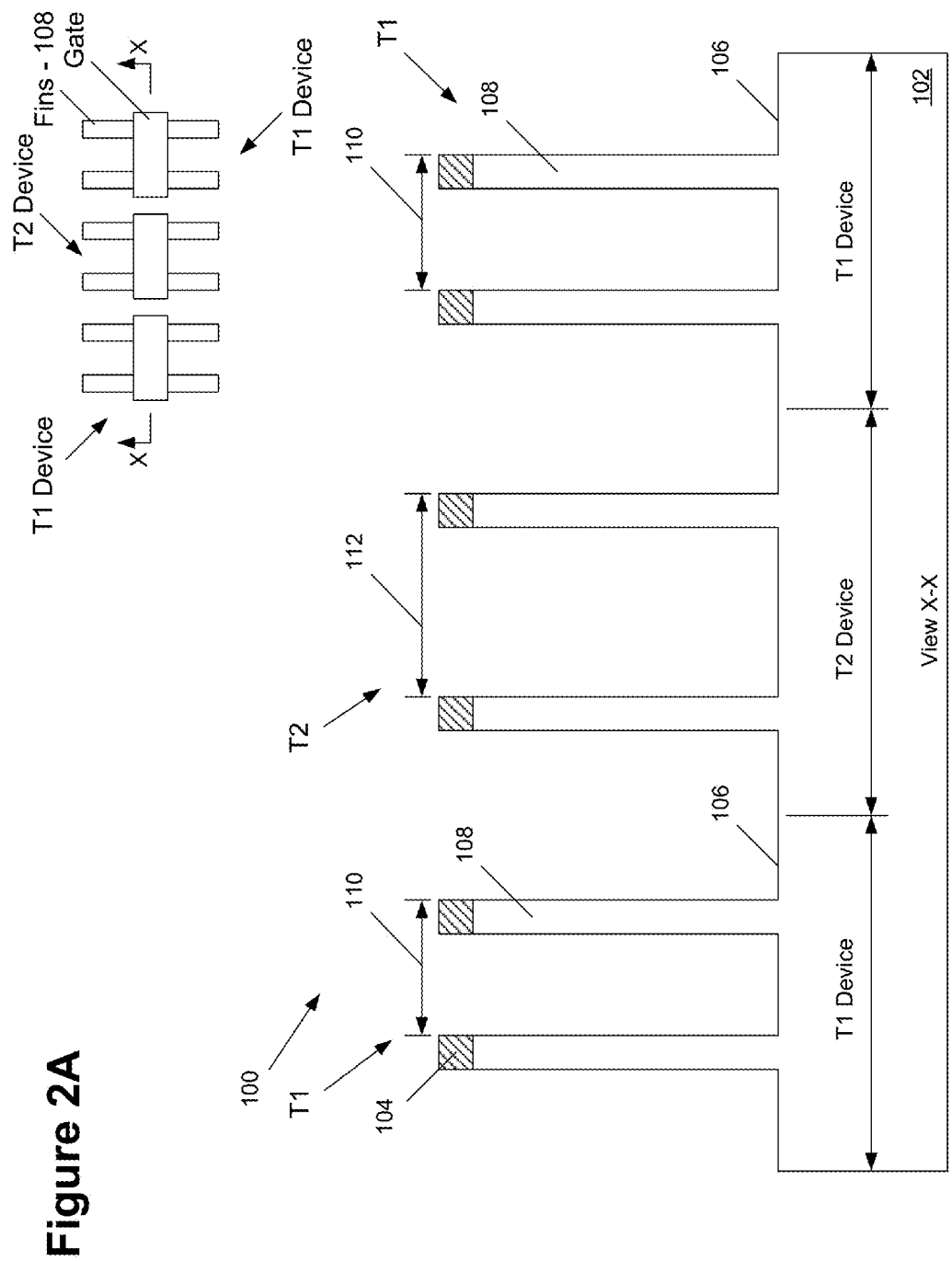
FIGS. 2A-2N depict various illustrative novel methods disclosed herein for forming punch through stop regions on FinFET devices on CMOS-based IC products using doped spacers.
Figure 2B:
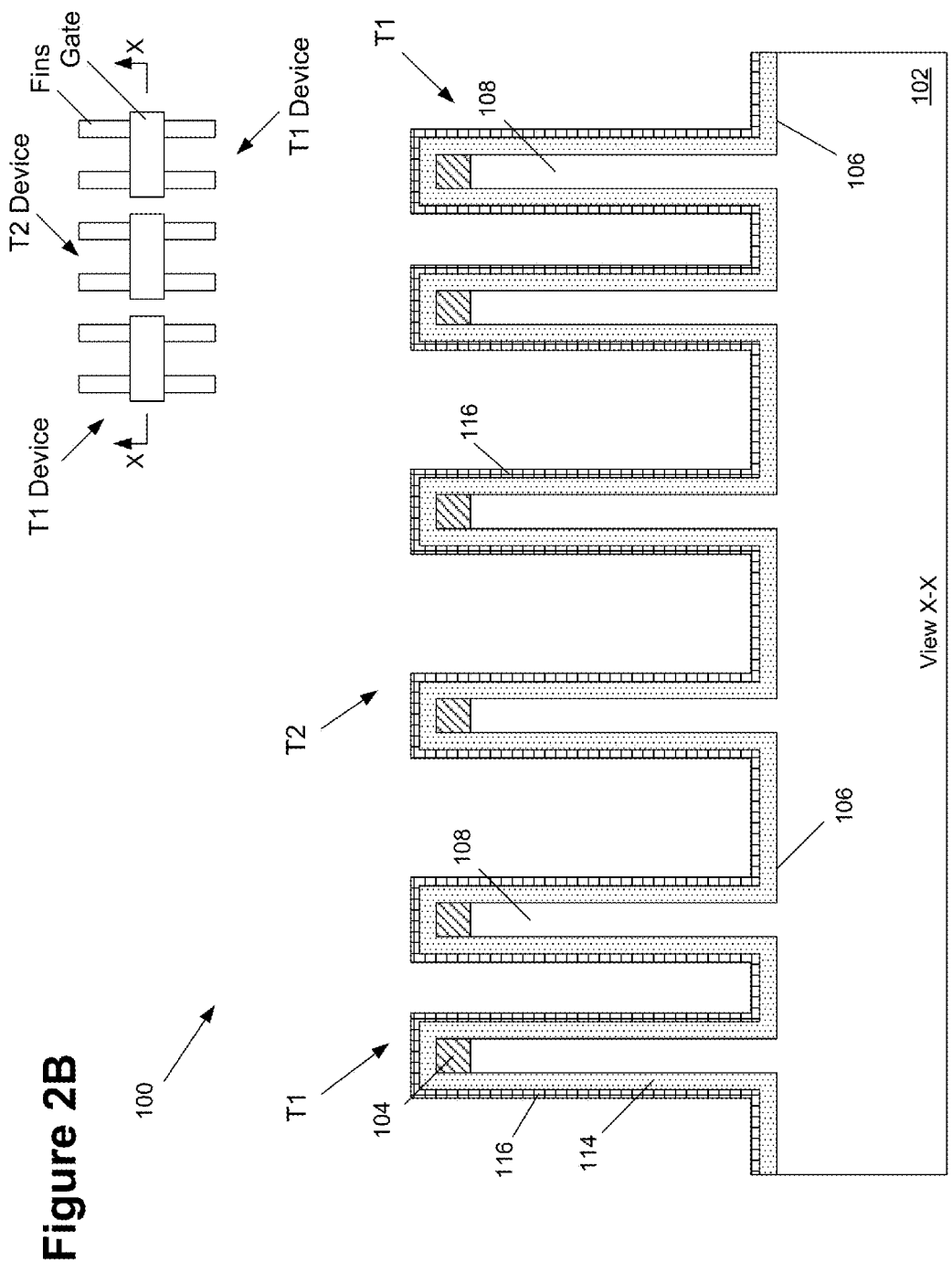
Figure 2C:
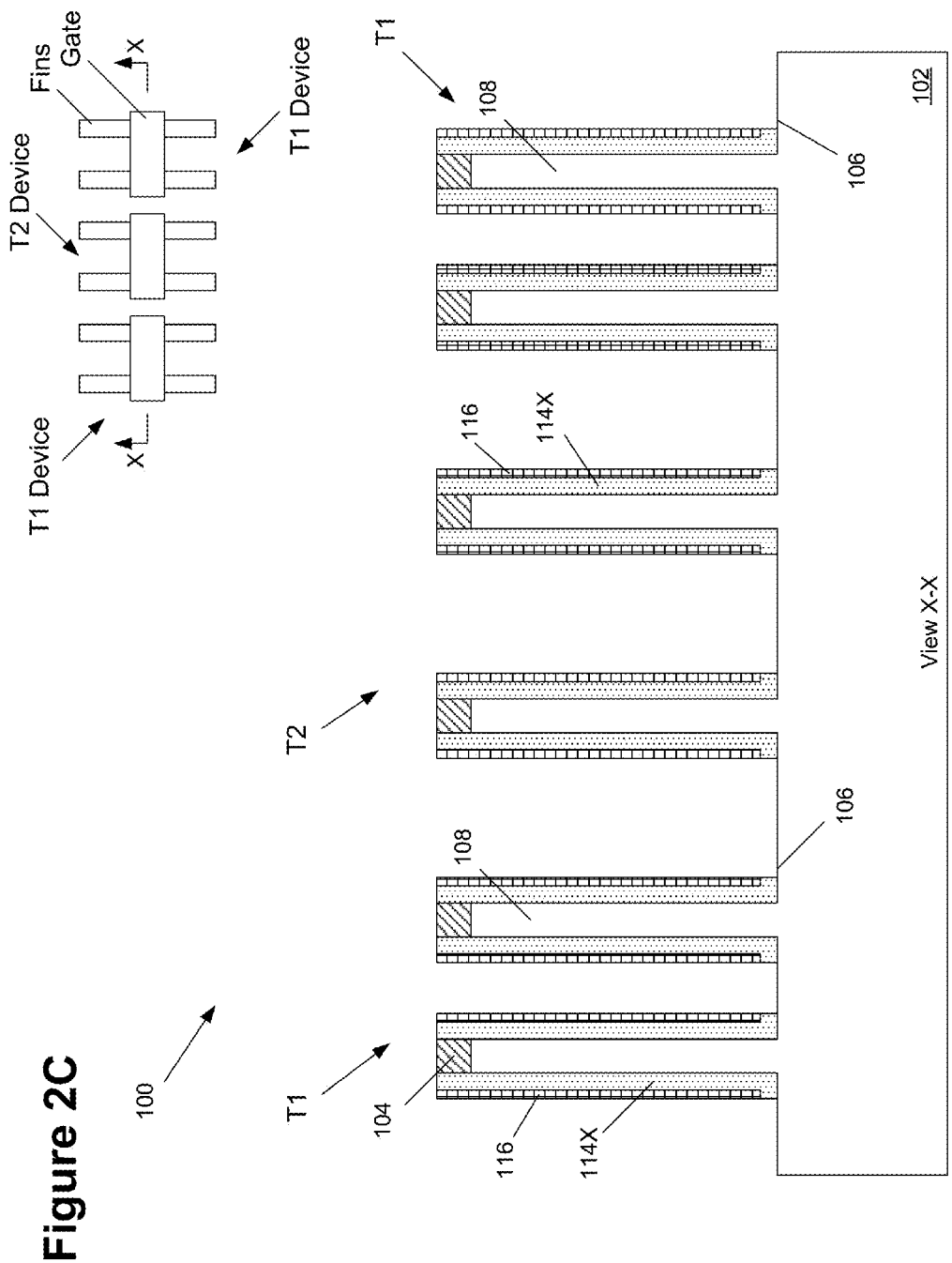
Figure 2D:
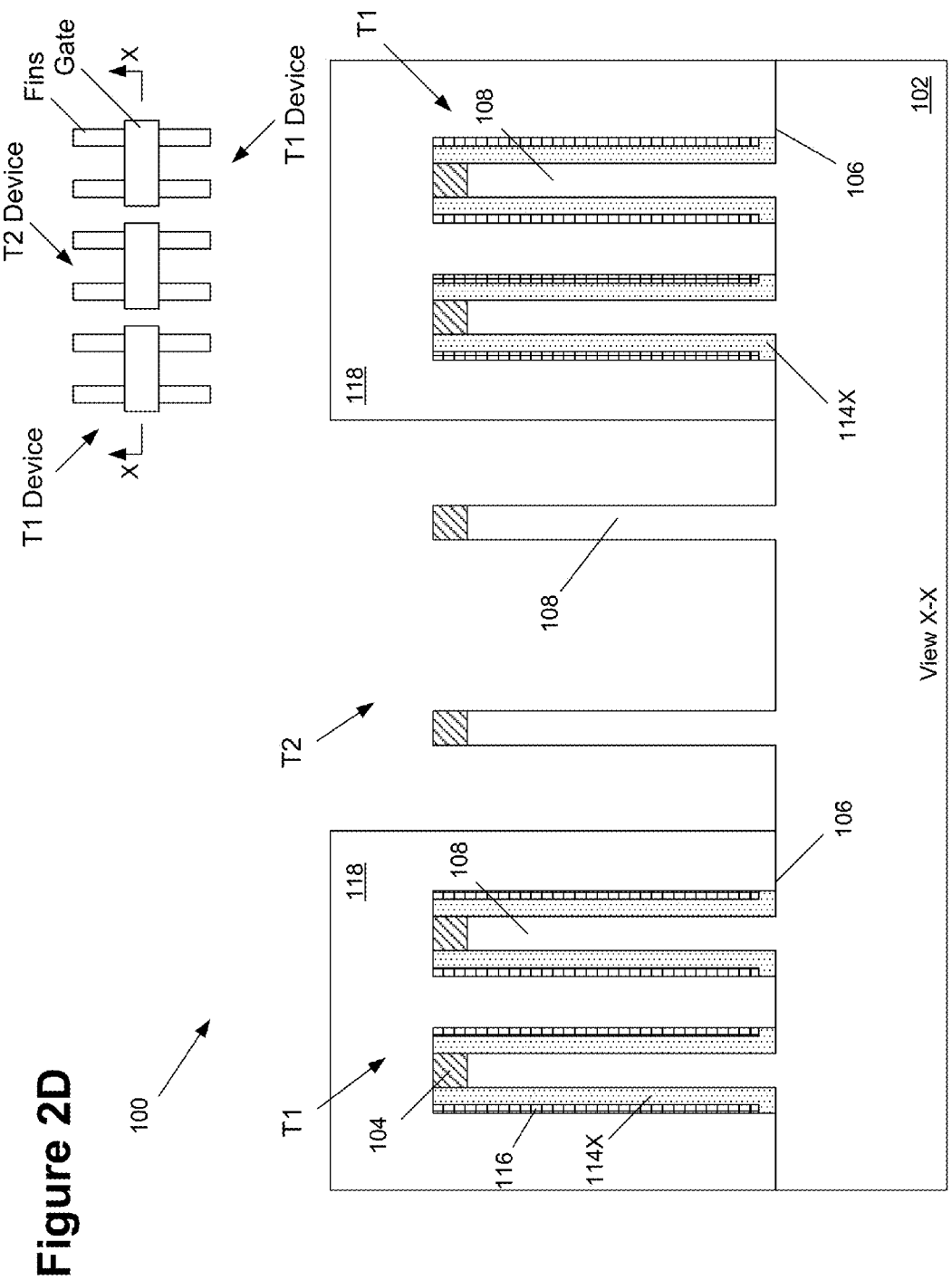
Figure 2E:
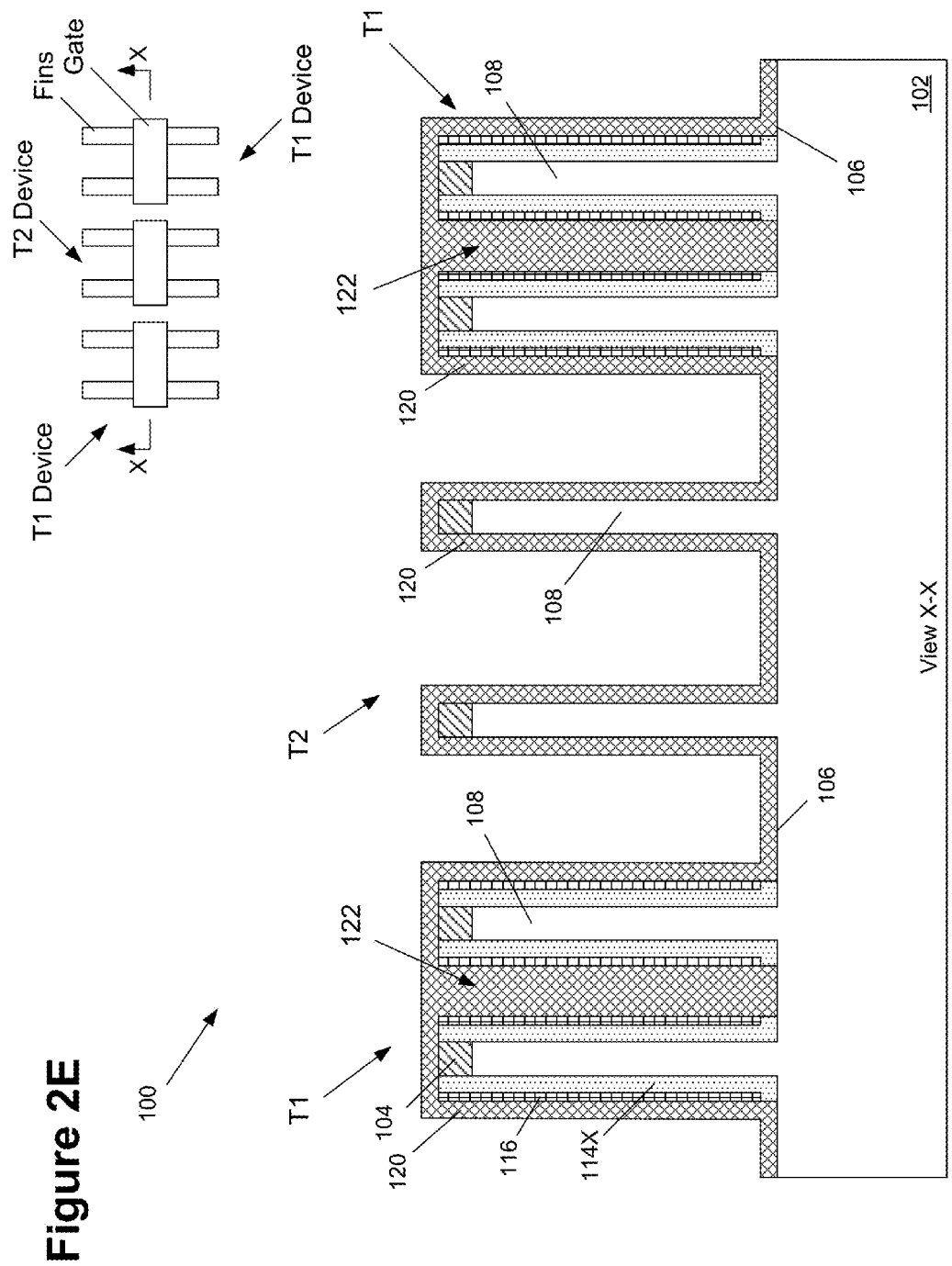
Figure 2F:
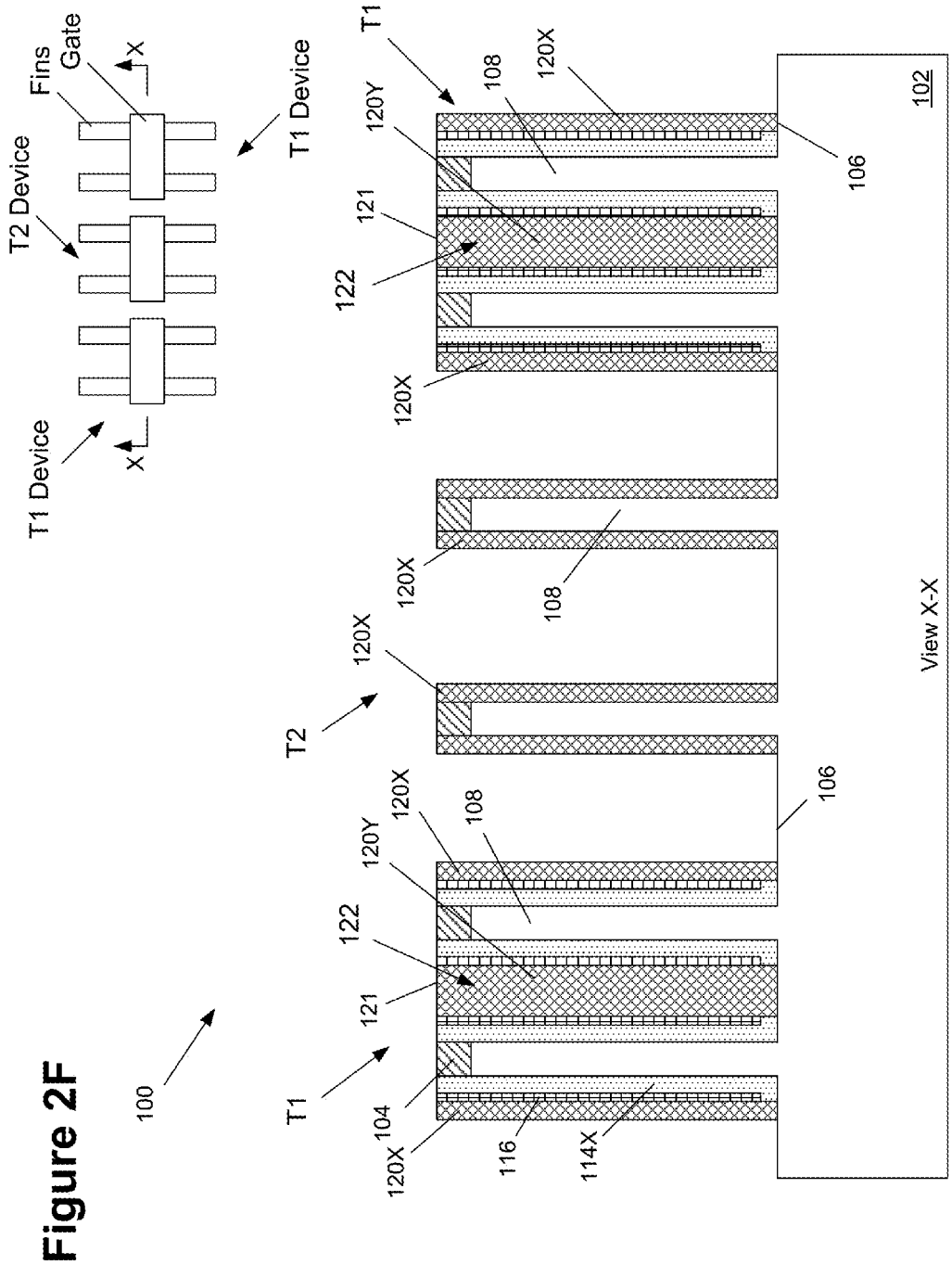
Figure 2G:
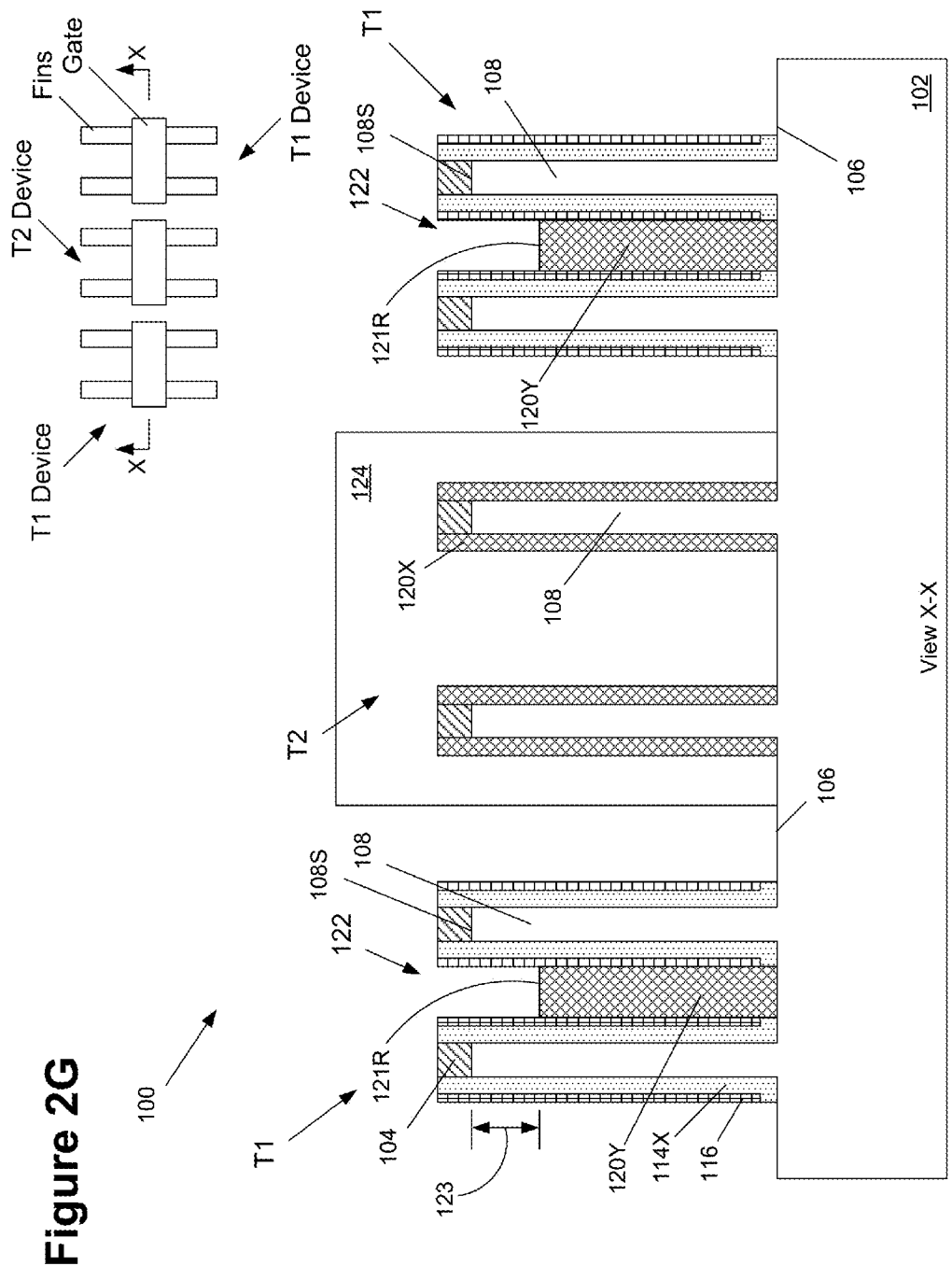
Figure 2I:
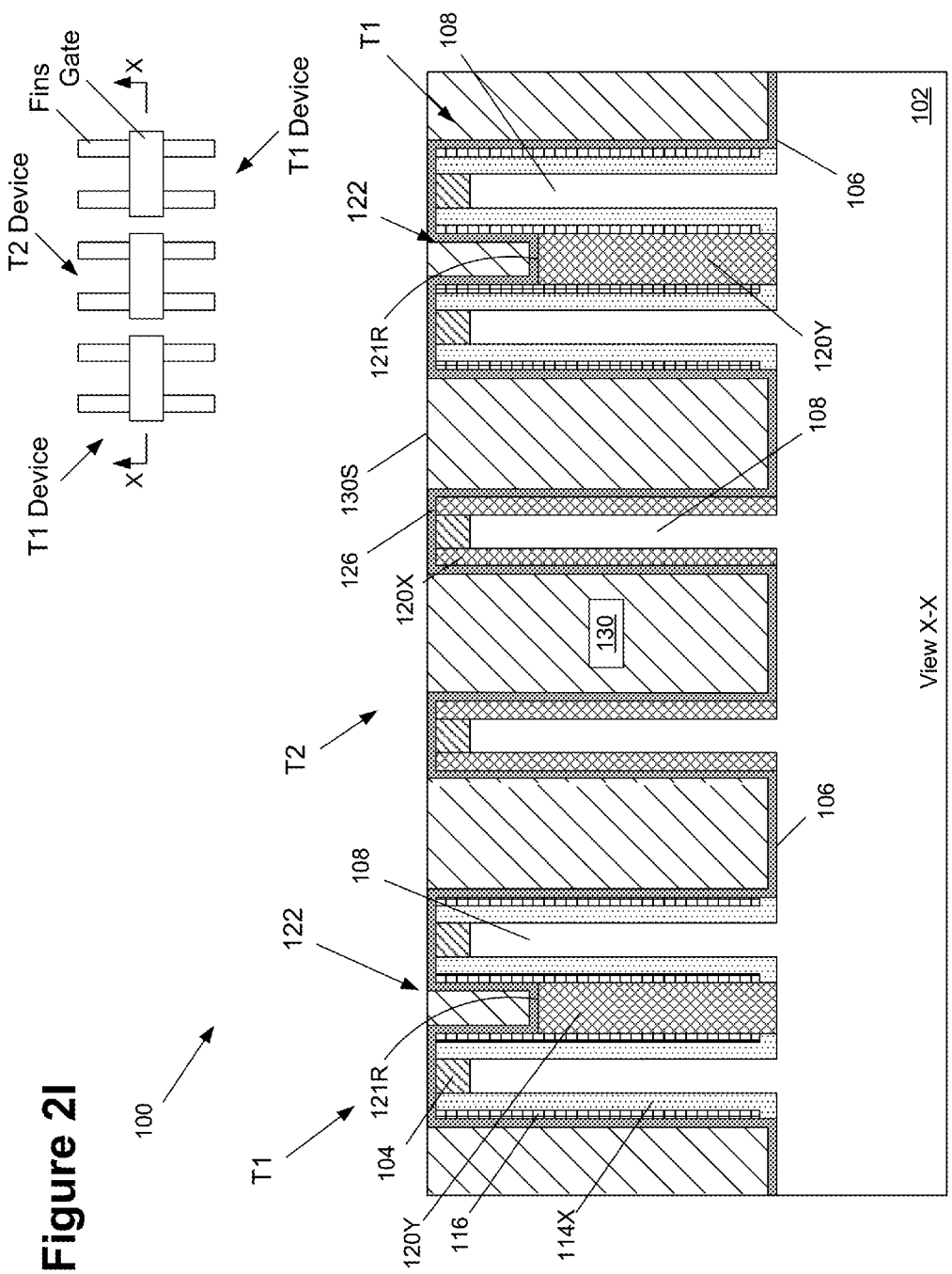
Figure 2J:
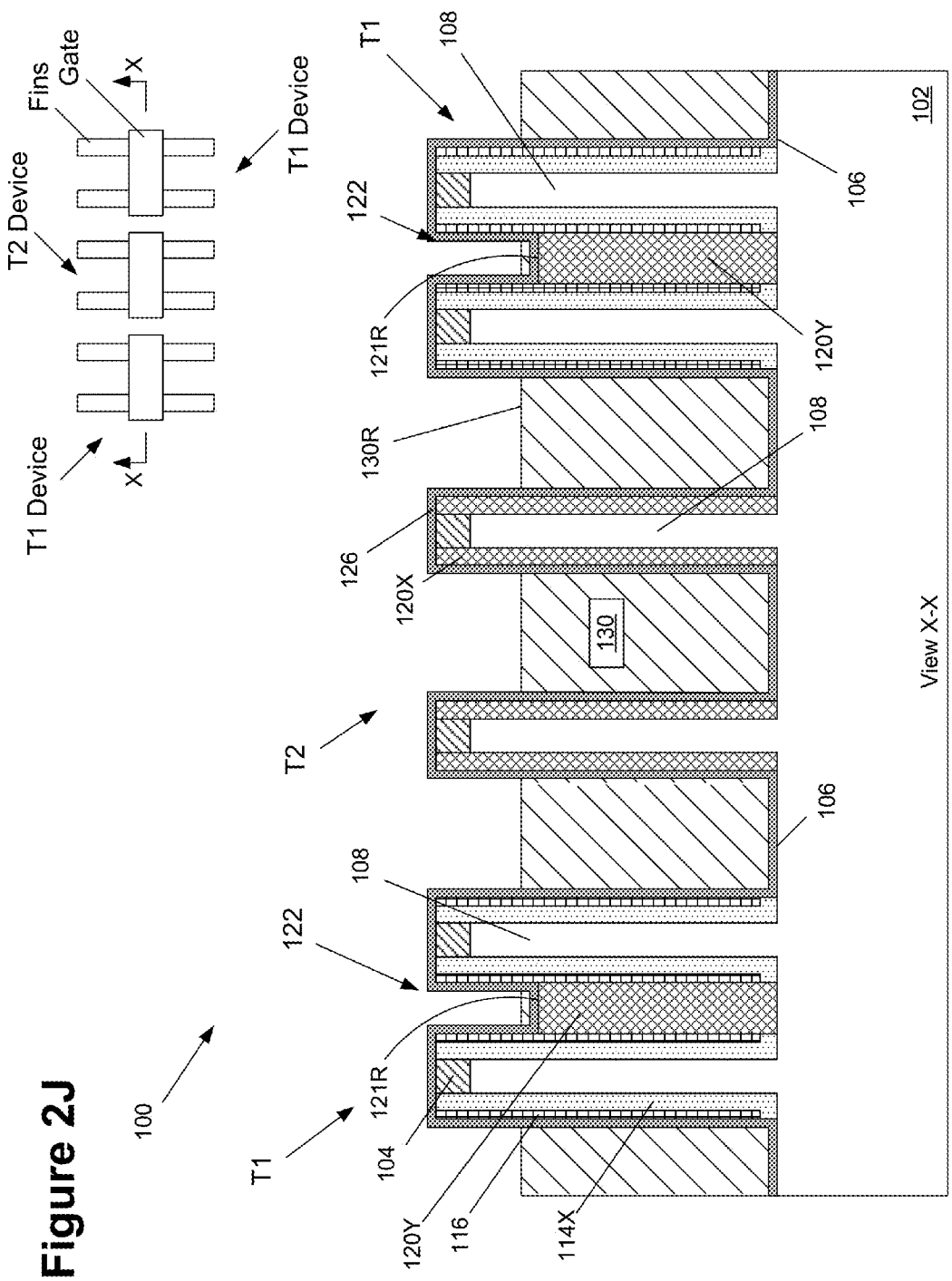
Figure 2K:
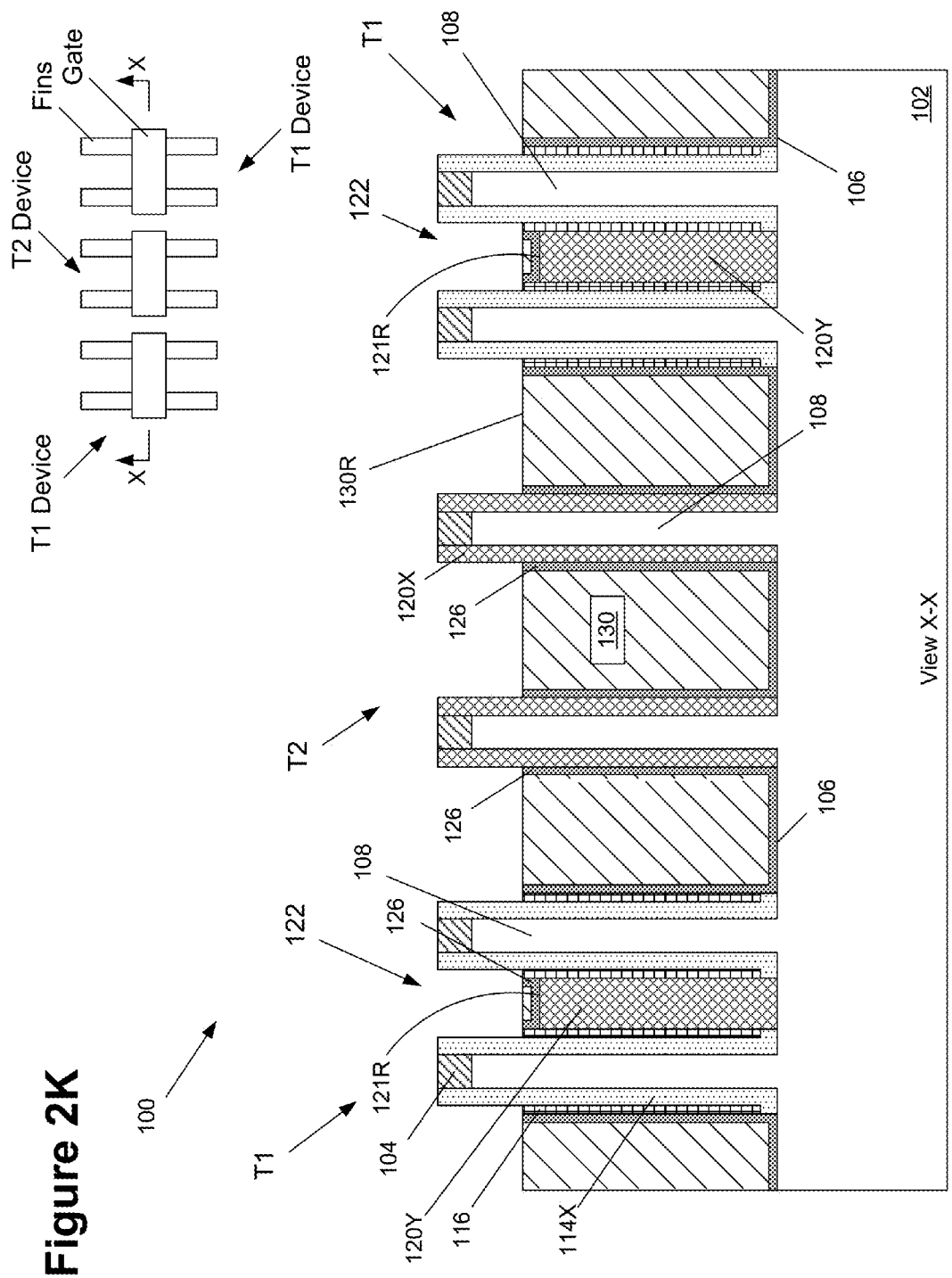
Figure 2L:
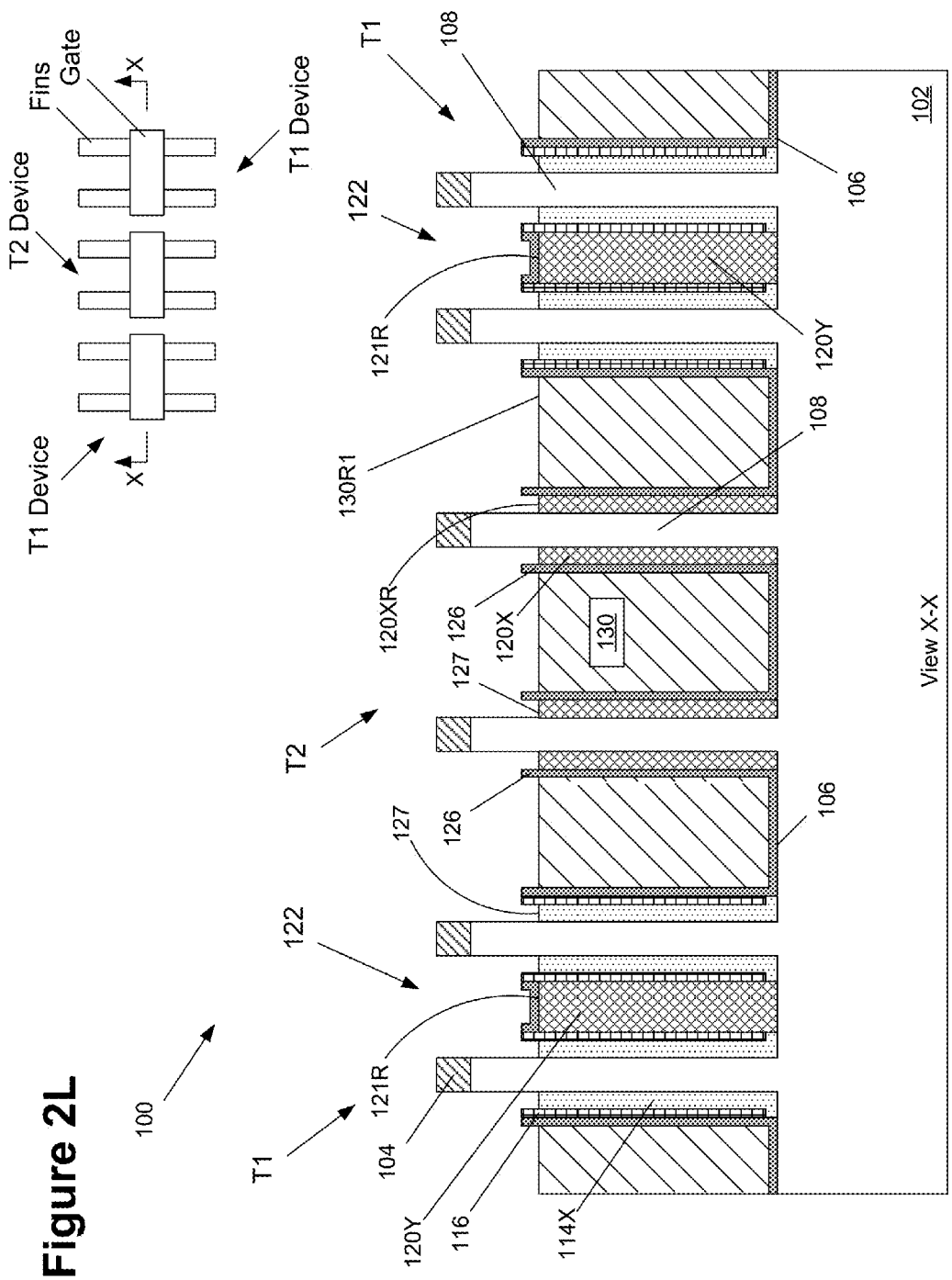
Figure 2N:
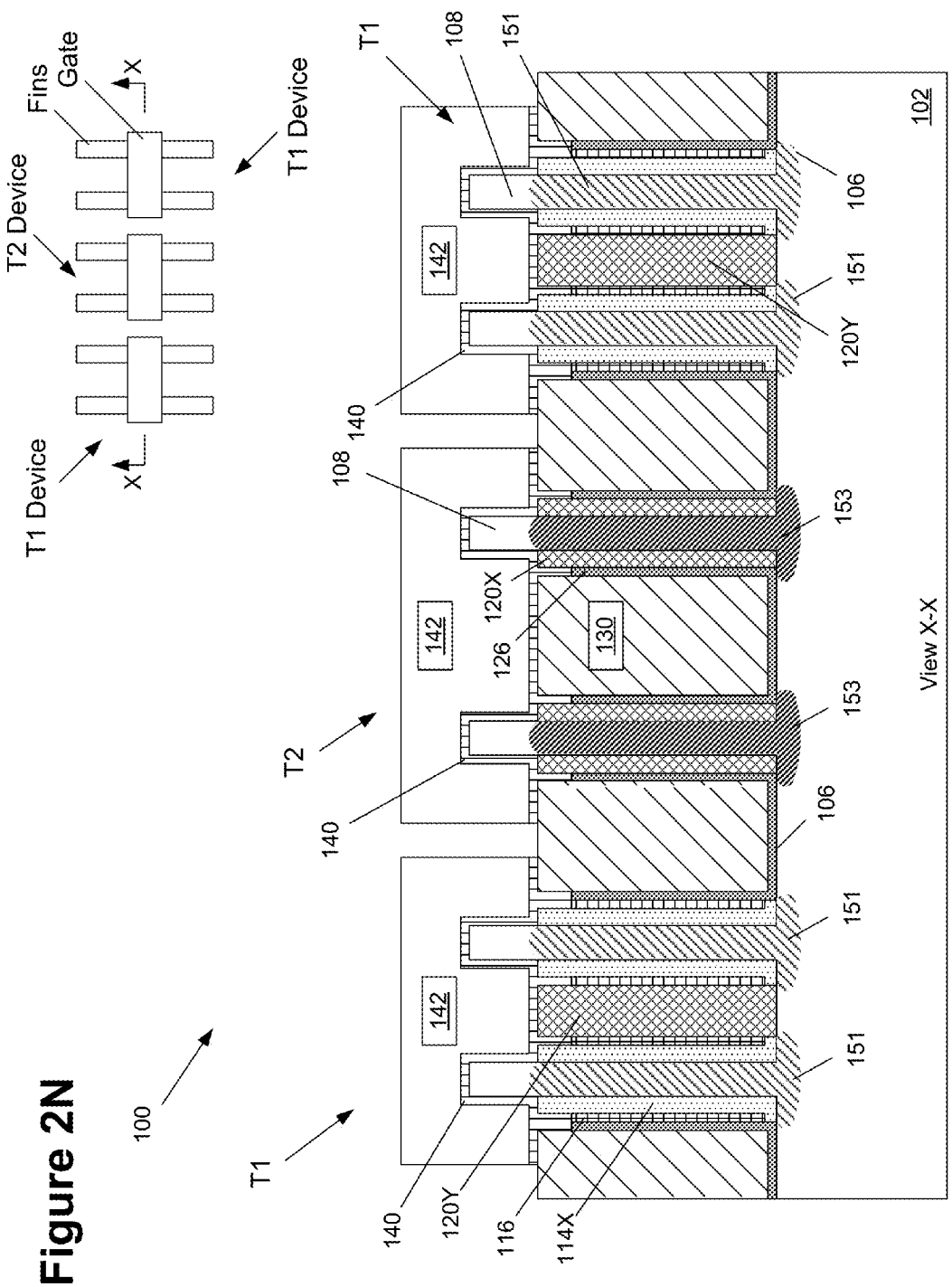

FIGS. 2A-2N present various views of one illustrative embodiment of an integrated circuit product 100 comprised of a plurality of FinFET devices that may be formed using the novel methods disclosed herein. In this example, the product 100 is comprised of two type 1 (T1) devices and one type 2 (T2) device, wherein the type 1 and type 2 devices are opposite type devices. For example, the T1 devices may be NMOS devices and the T2 device may be a PMOS device, or vice-versa. In the depicted example, all of the devices are comprised of two illustrative fins 108, but in practice they need not have the same number of fins 108 and the number of fins 108 on a given device may vary, e.g., one or more fins 108 on a single device. More specifically, in this example, the two T1 FinFET devices are formed above two T1 device regions in the substrate 102, while the single T2 device is formed above a T2 device region in the substrate 102. The type 1 and type 2 devices may be formed side-by-side as depicted in the drawings or they may be formed in spaced-apart regions of the substrate 102. A simplistic plan view is included in the upper right corner of the drawings to indicate where the cross-sectional views in the following drawings are taken. More specifically, the cross-sectional view depicted in the following drawings is taken in a direction that is transverse to the long axis of the fins 108, i.e., in the gate width direction of the FinFET devices T1, T2. However, no attempt will be made to show the processing depicted in the cross-sectional views in the simplistic plan view on each drawing.

In the examples depicted herein, the product 100 will be formed in and above a semiconductor substrate 102. The substrate 102 may have a variety of configurations, such as a semiconductor-on-insulator (SOI) configuration that includes a bulk semiconductor layer, a buried insulation layer and an active layer. Alternatively, the substrate 102 may have a simple bulk configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at the point where the fins 108 have been formed in the substrate 102 for the type 1 and type 2 devices. In the examples depicted herein, the fins 108 are defined by performing one or more etching processes through a patterned etch mask 104 to define a plurality of fin-formation trenches 106 in the substrate 102. In the illustrative example depicted in the attached figures, the fins 108 are all of a uniform size and shape. However, such uniformity in the size and shape of the fins 108 is not required to practice at least some aspects of the inventions disclosed herein. In the example depicted herein, the fins 108 are depicted as having been formed by performing an anisotropic etching process. In other cases, the fins 108 may be formed in such a manner that they have a tapered cross-sectional configuration (wider at the bottom than at the top at this point in the process flow). Thus, the size and configuration of the fins 108 and the manner in which they are made should not be considered a limitation of the present invention. The patterned etch mask 104 may be comprised of one or more layers of material and it may be formed by forming one or more layers of material and thereafter patterning those materials using known photolithography and etching techniques. In one illustrative embodiment, the patterned etch mask 104 may be comprised of a layer of silicon dioxide and a layer of silicon nitride formed on top of the layer of silicon dioxide. With continuing reference to FIG. 2A, in one illustrative embodiment, the fins 108 for the type 1 and type 2 devices may be formed with different fin pitches. For example, the T1 devices may be formed with a first fin pitch 110 while the T2 device may be formed with a second fin pitch 112 that is greater than the first fin pitch 110. Of course, if desired, the type 1 and type 2 devices may be formed with the same fin pitch.

In general, the methods disclosed herein involve, among other things, forming counter-doped spacers adjacent the fins 108 of the type 1 and type 2 devices. That is, a counter-doped spacer for the T1 devices will be doped with a type 2 dopant material (i.e., an opposite type dopant material), while a counter-doped spacer for the T2 device will be doped with a type 1 dopant material (i.e., an opposite type dopant material). Thus, in the case where the T1 devices are N-type devices, the counter-doped spacers for the T1 devices will be doped with a P-type dopant. Conversely, in the case where the T1 devices are P-type devices, the counter-doped spacers for the T1 devices will be doped with an N-type dopant. In general, the counter-doped spacers will be formed by depositing a doped layer of spacer material and thereafter performing an anisotropic etching process to define the counter-doped spacer. In one embodiment, the counter dopant material may be introduced into the layer of spacer material in situ, i.e., as it is being formed. In general, the counter-doped spacers may have a concentration of counter dopant material that falls within the range of about $1\times10^{10}$-$1\times10^{20}$ atoms/cm$^3$. In the case where the counter-doped spacers are doped with an N-type dopant, the dopant material may comprise, for example, phosphorous, arsenic, etc. In the case where the counter-doped spacers are doped with a P-type dopant, the dopant material may comprise, for example, boron, boron difluoride, gallium, etc.

FIG. 2B depicts the product 100 after several process operations were performed. First, a conformal deposition process (e.g., ALD, PECVD, CVD, etc.) was performed to form a type 2 doped layer of silicon dioxide 114 around the fins 108 for the type 1 and type 2 devices. In the depicted example, the type 2 doped layer of silicon dioxide 114 was formed on and in contact with the sidewalls of the fins 108 and on the exposed bottom surface of the fin-formation trenches 106. The thickness of the type 2 doped layer of silicon dioxide 114 may vary depending upon the particular application, e.g., 2-10 nm. Next, a conformal deposition process was performed to form a liner layer 116 on the type 2 doped layer of silicon dioxide 114. The liner layer 116 may be comprised of a material that exhibits good etch selectivity to the type 2 doped layer of silicon dioxide 114. For example, the liner layer 116 may be comprised of a material such as silicon nitride, silicon oxynitride, SIBCN, SiOCN etc. The thickness of the liner layer 116 may vary depending upon the particular application, e.g., 2-10 nm.

FIG. 2C depicts the product 100 after a plurality of anisotropic etching processes were sequentially performed to remove portions of the liner layer 116 and the type 2 doped layer of silicon dioxide 114. These process operations result in the formation a type 2 doped spacer structure 114X adjacent each of the fins 108 for the type 1 and type 2 devices with a portion of the liner layer 116 positioned on the outer surface of the type 2 doped spacer structure 114X.

FIG. 2D depicts the product 100 after several process operations were performed. First, a patterned masking layer 118, e.g., a patterned layer of photoresist, was formed above the product 100. The patterned masking layer 118 covers the type 1 devices and exposes the type 2 device for further processing. Next, one or more etching processes were performed to remove the type 2 doped spacer structures 114X and the liner layer 116 from the type 2 device. This process operation exposes the sidewalls of the fins 108 on the type 2 device. As depicted, the type 2 doped spacer structures 114X remain positioned adjacent the fins 108 on the type 1 devices.

FIG. 2E depicts the product 100 after several process operations were performed. First, the patterned masking layer 118 was removed. Next, a conformal deposition process (e.g., ALD, PECVD, CVD, etc.) was performed to form a type 1 doped layer of silicon dioxide 120 around the fins 108 for the type 2 device and on the type 1 device. During the formation of the type 1 doped layer of silicon dioxide 120, the space 122 between the fins 108 on the type 1 devices is substantially filled with the type 1 doped layer of silicon dioxide material 120, i.e., the type 1 doped layer of silicon dioxide 120 "pinches-off" in the space 122. Also note that the type 1 doped layer of silicon dioxide 120 is formed (in a conformal nature) around the layer 116 on the sides of the fins 108 opposite the space 122. In the depicted example, the type 1 doped layer of silicon dioxide 120 was formed on and in contact with the sidewalls of the fins 108 of the type 2 device and on the exposed bottom surfaces of the fin-formation trenches 106 in both the type 1 devices and the type 2 device. The thickness of the type 1 doped layer of silicon dioxide 120 may vary depending upon the particular application, e.g., 2-10 nm.

FIG. 2F depicts the product 100 after an anisotropic etching process was performed to form a plurality of type 1 doped spacer structures 120X. Note that the type 1 doped spacer structures 120X are formed adjacent each of the fins 108 for the type 2 device. This process operation also results in the formation of a type 1 doped material structure 120Y positioned within the space 122 between the fins 108 on the type 1 devices. At this point in the process flow, the type 1 doped material structure 120Y has an upper surface 121. This process operation also exposes the upper surface of features of the patterned mask layer 104.

FIG. 2G depicts the product 100 after several process operations were performed. First, a patterned masking layer 124, e.g., a patterned layer of photoresist, was formed above the product 100. The patterned masking layer 124 covers the type 2 device and exposes the type 1 devices for further processing. Next, an isotropic etching process was performed to remove type 1 doped spacer structures 120X exposed by the masking layer 124. This etching process also recesses the type 1 doped material structure 120Y such that it has a recessed upper surface 121R that is positioned at a level that is below the level of the upper surface 108S of the fins 108 on the type 1 devices. As will be appreciated by those skilled in the art after a complete reading of the present application, the distance 123 between the recessed surface 121R and the upper surface 108S of the fins 108 will generally correspond to the final fin height for type 1 devices. The distance 123 may vary depending upon the particular application. In one embodiment, the distance 123 may be on the order of about 30-50 nm. As depicted, the type 1 doped spacer structures 120X remain positioned adjacent the fins 108 on the type 2 device.

FIG. 2H depicts the product 100 after several process operations were performed. First, the patterned masking layer 124 was removed. Next, a conformal deposition process was performed to form another liner layer 126 on the type 1 and type 2 devices. The liner layer 126 may be comprised of the same material and have the same characteristics as does the above-described liner layer 116.

FIG. 2I depicts the product 100 after several process operations were performed. First a layer of flowable oxide 130 (e.g., an HSQ-based flowable oxide material—an initial liquid-like state $SiO_x$ material) was formed on the substrate 102. The flowable oxide layer 130 may, in one embodiment, be formed by depositing the liquid state flowable oxide material on the substrate 102 and thereafter performing one or more heating processes to cure and densify the flowable oxide material to $SiO_2$. Next, a chemical mechanical polishing process was performed on the flowable oxide material that stopped on the liner layer 126. After this CMP process, the layer of flowable oxide material 130 has a planarized upper surface 130S.

FIG. 2J depicts the product 100 after a timed, recess etching process was performed on the flowable oxide material 130 such that it has a recessed upper surface 130R. The amount of recessing of the flowable oxide material 130 may vary depending upon the particular application. In one embodiment, the flowable oxide material 130 is recessed such that some portion of the flowable oxide material 130 remains positioned above the liner layer 126 positioned above the recessed upper surface 121R of the type 1 doped material structure 120Y in the space 122 on the type 1 devices. Note that this recess etching process only involves recessing a single material—the flowable oxide material 130—thereby enabling a more uniform depth of the recessing.

FIG. 2K depicts the product 100 after a timed, isotopic etching process was performed to remove portions of the liner layer 126 and the liner layer 116 positioned above the recessed surface 130R of the flowable oxide material 130. The remaining part of the liner layer 126 positioned above the recessed upper surface 121R of the type 1 doped material structure 120Y in the space 122 on the type 1 devices will function as a protective cap layer for the underlying type 1 doped material structure 120Y during subsequent processing. In some cases, portions of the features of the masking layer 104 may also be reduced in thickness during this timed, isotopic etching process, but such reduction in thickness is not depicted in the drawings.

FIG. 2L depicts the product 100 after a timed, recess etching process was performed to remove portions of the type 2 doped spacer structures 114X on the type 1 devices and the type 1 doped spacer structures 120X on the type 2 device. The recessing of the spacer structures 114X, 120X is performed until such time as their recessed upper surfaces 127 is substantially planar with the recessed upper surface 121R of the underlying type 1 doped material structures 120Y. Since the spacer structures 114X, 120X are comprised of doped silicon dioxide materials that were formed by performing a conformal deposition process, the spacer structures 114X, 120X should have an etch rate that is approximately the same, thereby enabling a more uniform depth of the recessing of the spacer structures 114X, 120X. This etching process also removes portions of the flowable oxide material layer 130 such that it now has a recessed upper surface 130R1 that is at a level that is lower than its previously recessed surface 130R shown in FIG. 2K. Note that, during this etching process, the flowable oxide material 130 is cleared from above the liner layer 126 (i.e., the protective cap layer) positioned above the underlying type 1 doped material structure 120Y on the type 1 devices.

FIG. 2M depicts the product after one or more etching processes was performed to remove the patterned masking layer 104 and portions of the liner layers 116, 126. This process operation exposes the upper surface 108S of the fins 108 on both the type 1 devices and the type 2 devices, as well as the exposure of the recessed upper surface 121R of the type 1 doped material structure 120Y on the type 1 devices. This process operation also recesses the liner layers 116, 126 to some degree below the recessed surface 130R1 of the flowable oxide layer 130.

FIG. 2N depicts the product 100 after a plurality of simplistically depicted and representative gate structures are formed for the type 1 devices and the type 2 device. The simplistically depicted gate structures generally comprise a gate insulation layer 140 and one or more conductive materials that function as the gate electrode 142. The gate structures may be formed using well known gate-first or replacement gate manufacturing techniques. Of course, the materials or composition of the gate structures may be different for type 1 devices and the type 2 device.

At some point in the process flow, one or more heating processes are performed to cause the dopant materials in the spacers 114X, 120X to migrate into their respective fins 108 and thereby form a type 2 counter-doped punch through stop region 151 on the type 1 devices and a type 1 counter-doped punch through stop region 153 on the type 2 device. In some cases, a dedicated heating process performed for the sole purpose of causing the migration of the dopant materials from the spacers 114X, 120X may be performed, e.g., an RTA process at a temperature that falls within the range of about 700-1000° C. In other applications, the heating process(es) that is performed to cause migration of the dopant materials from the spacers 114X, 120X may be performed to accomplish other tasks as it relates to the formation of the T1 devices and the T2 device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method comprising:
    forming a first plurality of fins for a type 1 device and a second plurality of fins for a type 2 device, wherein said type 1 and said type 2 devices are opposite type devices;
    forming a first counter-doped sidewall spacer structure adjacent each of said first plurality of fins, said first counter-doped sidewall spacer comprising a first material comprising silicon dioxide and a type 2 dopant;
    performing at least one first process operation to form a second counter-doped sidewall spacer structure adjacent each of said second plurality of fins, said second counter-doped sidewall spacer comprising a second material comprising silicon dioxide and a type 1 dopant that is opposite to said type 2 dopant, wherein performing said at least one first process operation fills a space between said first plurality of fins with said second material so as to define a recessed second material structure with a first recessed upper surface that is positioned at a level below an upper surface of said first plurality of fins;
    forming a recessed layer of flowable oxide having a second recessed upper surface on said type 1 and said type 2 devices, wherein, after said recessed layer of flowable oxide is formed, a portion of said first counter-doped sidewall spacer is exposed above said second recessed upper surface and a portion of said second counter-doped sidewall spacer structure is exposed above said second recessed upper surface; and
    performing a common etching process operation to remove at least a portion of said exposed portion of said first counter-doped sidewall spacer structure and to remove at least a portion of said exposed portion of said second counter-doped sidewall spacer structure so as to reveal at least a portion of said first and second plurality of fins, respectively.

2. The method of claim 1, wherein said type 1 device is an N-type device, said type 2 device is a P-type device, said type 1 dopant is a P-type dopant and said type 2 dopant is an N-type dopant.

3. The method of claim 1, wherein said type 1 device is a P-type device, said type 2 device is an N-type device, said type 1 dopant is an N-type dopant and said type 2 dopant is a P-type dopant.

4. The method of claim 1, wherein said type 1 device is an N-type device, said type 2 device is a P-type device, said first material is boron-doped silicon dioxide and said second material is phosphorous-doped silicon dioxide.

5. The method of claim 1, wherein forming said first counter-doped sidewall spacer structure comprises:
    performing a first conformal deposition process to form a layer of said first material on and in contact with said first plurality of fins; and
    performing a first anisotropic etching process on said layer of said first material.

6. The method of claim 5, wherein performing said at least one first process operation comprises:
    performing a second conformal deposition process to form a layer of said second material on and in contact with said second plurality of fins and adjacent said first counter-doped sidewall spacer structure such that said space between said first plurality of fins is filled with said second material;
    performing a second anisotropic etching process on said layer of said second material so as to form said second counter-doped spacer structure on each of said second plurality of fins;
    forming a first masking layer that covers said type 2 device and exposes said type 1 device; and
    performing an etching process so as to remove portions of said second material on said type 1 device and so as to thereby result in said recessed second material structure with said first recessed upper surface.

7. The method of claim 1, wherein forming said recessed layer of flowable oxide having said second recessed upper surface comprises:
    depositing said layer of flowable oxide on said type 1 device and said type 2 device so as to over-fill any spaces between all of said first and second plurality of fins;
    planarizing an upper surface of said deposited layer of flowable oxide; and
    performing a recess etching process on said planarized layer of flowable oxide.

8. The method of claim 1, wherein, prior to forming said recessed layer of flowable oxide, the method further comprises performing a conformal deposition process to form a conformal layer material adjacent said first plurality of fins, above said recessed second material structure and on and in contact with said second counter-doped spacer structure on said type 2 device, wherein said conformal layer of material comprises one of silicon nitride, silicon oxynitride, SIBCN or SiOCN.

9. The method of claim 1, wherein, after performing said common etching process operation, at least a portion of said recessed second material structure remains positioned on said type 1 device.

10. The method of claim 1, further comprising:
forming a first gate structure that is positioned around said exposed portion of said first plurality of fins and above said recessed second material structure; and
forming a second gate structure that is positioned around said exposed portion of said second plurality of fins.

11. The method of claim 1, wherein said type 1 dopant is an N-type dopant comprising one of phosphorus or arsenic and said type 2 dopant is a P-type dopant comprising one of boron or gallium.

12. The method of claim 1, wherein said type 1 dopant is a P-type dopant comprising one of boron or gallium and said type 2 dopant is an N-type dopant comprising one of phosphorus or arsenic.

13. The method of claim 1, wherein, during the performance of said common etching process, said recessed second material structure is protected from said common etching process by a cap layer positioned above said recessed second material structure.

14. The method of claim 1, wherein said first plurality of fins are formed with a first fin pitch and said second plurality of fins are formed with a second fin pitch, said second fin pitch being greater than said first fin pitch.

15. A method comprising:
forming a first plurality of fins for a type 1 device and a second plurality of fins for a type 2 device, wherein said type 1 and said type 2 devices are opposite type devices;
performing at least one first process operation to form a first counter-doped sidewall spacer structure adjacent each of said first and second plurality of fins, said first counter-doped sidewall spacer structure comprising a first material comprising silicon dioxide and a type 2 dopant;
performing at least one second process operation to remove said first counter-doped sidewall spacer structures adjacent said second plurality of fins while leaving said first counter-doped sidewall spacer structures in position adjacent said first plurality of fins;
performing at least one third process operation to form a second counter-doped sidewall spacer structure on each of said second plurality of fins, said second counter-doped sidewall spacer structure comprising a second material comprising silicon dioxide and a type 1 dopant that is opposite to said type 2 dopant, wherein performing said at least one third process operation fills a space between said first plurality of fins with said second material so as to define a second material structure that is positioned between said first plurality of fins;
performing at least one fourth process operation to remove said second counter-doped sidewall spacer structures adjacent said first plurality of fins while leaving said second counter-doped sidewall spacer structures in position adjacent said second plurality of fins and to recess an upper surface of said second material structure so as to define a recessed second material structure with a first recessed upper surface that is positioned at a level below an upper surface of said first plurality of fins;

forming a recessed layer of flowable oxide having a second recessed upper surface on said type 1 and said type 2 devices, wherein, after said recessed layer of flowable oxide is formed, a portion of said first counter-doped sidewall spacer structure is exposed above said second recessed upper surface and a portion of said second counter-doped sidewall spacer structure is exposed above said second recessed upper surface; and
performing a common etching process operation to remove at least a portion of said exposed portion of said first counter-doped sidewall spacer structure and to remove at least a portion of said exposed portion of said second counter-doped sidewall spacer structure so as to reveal at least a portion of said first and second plurality of fins, respectively.

16. The method of claim 15, wherein performing said at least one first process operation to form said first counter-doped sidewall spacer structure comprises:
performing a first conformal deposition process to form a layer of said first material on and in contact with sidewalls of said first plurality of fins and on and in contact with sidewalls of said second plurality of fins; and
performing a first anisotropic etching process on said layer of said first material.

17. The method of claim 16, wherein performing said at least one second process operation comprises:
forming a first masking layer that covers said type 1 device and exposes said type 2 device; and
performing an etching process to remove said first counter-doped sidewall spacer structures from said type 2 device.

18. The method of claim 17, wherein performing said at least one third process operation comprises:
performing a second conformal deposition process to form a layer of said second material on and in contact with sidewall of said second plurality of fins and adjacent said first counter-doped sidewall spacer structure such that said space between said first plurality of fins is filled with said second material; and
performing a second anisotropic etching process on said layer of said second material so as to form said second counter-doped spacer structures on each of said second plurality of fins and so as to define said second material structure that is positioned between said first plurality of fins.

19. The method of claim 18, wherein performing said at least one fourth process operation comprises:
forming a second masking layer that covers said type 2 device and exposes said type 1 device; and
performing an etching process so as to remove portions of said second material on said type 1 device and so as to thereby result in said recessed second material structure with said first recessed upper surface.

20. The method of claim 15, wherein forming said recessed layer of flowable oxide having said second recessed upper surface comprises:
depositing said layer of flowable oxide on said type 1 device and said type 2 device so as to over-fill any spaces between all of said first and second plurality of fins;
planarizing an upper surface of said deposited layer of flowable oxide; and
performing a recess etching process on said planarized layer of flowable oxide.

21. The method of claim 15, wherein, prior to forming said recessed layer of flowable oxide, the method further comprises performing a conformal deposition process to form a conformal layer of material adjacent said first plurality of fins, above said recessed second material structure and on and in contact with said second counter-doped spacer structure on said type 2 device, wherein said conformal layer of material comprises one of silicon nitride, silicon oxynitride, SIBCN or SiOCN.

22. The method of claim 15, wherein, after performing said common etching process operation, at least a portion of said recessed second material structure remains positioned on said type 1 device.

23. The method of claim 15, further comprising:
    forming a first gate structure that is positioned around said exposed portion of said first plurality of fins and above said recessed second material structure; and
    forming a second gate structure that is positioned around said exposed portion of said second plurality of fins.

24. The method of claim 15, wherein, during the performance of said common etching process, said recessed second material structure is protected from said common etching process by a cap layer positioned above said recessed second material structure.

25. The method of claim 15, wherein said first plurality of fins are formed with a first fin pitch and said second plurality of fins are formed with a second fin pitch, said second fin pitch being greater than said first fin pitch.

\* \* \* \* \*